United States Patent
Heo et al.

(10) Patent No.: US 10,529,874 B2
(45) Date of Patent: Jan. 7, 2020

(54) METHOD FOR MANUFACTURING A COMPOUND SEMICONDUCTOR SOLAR CELL

(71) Applicant: LG Electronics Inc., Seoul (KR)

(72) Inventors: Younho Heo, Seoul (KR); Soohyun Kim, Seoul (KR); Hyun Lee, Seoul (KR); Changhyun Jeong, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 15/951,379

(22) Filed: Apr. 12, 2018

(65) Prior Publication Data
US 2018/0301577 A1    Oct. 18, 2018

(30) Foreign Application Priority Data
Apr. 12, 2017    (KR) .................. 10-2017-0047311

(51) Int. Cl.
*H01L 31/0224* (2006.01)
*H01L 31/02* (2006.01)
*H01L 31/18* (2006.01)
*H01L 31/0216* (2014.01)
*H01L 31/0304* (2006.01)

(52) U.S. Cl.
CPC .......... *H01L 31/022441* (2013.01); *H01L 31/02008* (2013.01); *H01L 31/02168* (2013.01); *H01L 31/0304* (2013.01); *H01L 31/1868* (2013.01); *H01L 31/1888* (2013.01); *H01L 31/1892* (2013.01); *Y02E 10/50* (2013.01)

(58) Field of Classification Search
CPC ....... H01L 31/022441; H01L 31/02008; H01L 31/02168; H01L 31/0304; H01L 31/1868; H01L 31/1888; H01L 31/1892; Y02E 10/50
See application file for complete search history.

(56) References Cited

FOREIGN PATENT DOCUMENTS

| JP | 2008270604 | 11/2008 |
|---|---|---|
| JP | 2012054388 | 3/2012 |
| JP | 2014017366 | 1/2014 |
| KR | 20130059971 | 6/2013 |
| WO | WO2014002824 | 1/2014 |

OTHER PUBLICATIONS

International Search report in International Application No. PCT/KR2018/004103, dated Jul. 31, 2018, 3 pages.

*Primary Examiner* — Seahvosh Nikmanesh
(74) *Attorney, Agent, or Firm* — Fish & Richardson P.C.

(57) ABSTRACT

According to an aspect of the present invention, there is provided a method for manufacturing a compound semiconductor solar cell, comprising: forming a sacrificial layer on one surface of a mother substrate; forming a compound semiconductor layer on the sacrificial layer; forming a first protective layer formed of a compound semiconductor on the compound semiconductor layer; depositing a second passivation layer on the first passivation layer; attaching a first lamination film on the second protective layer; separating the compound semiconductor layer, the first and second protective layers, and the first lamination film from the mother substrate by performing an ELO process to remove the sacrificial layer; forming a back electrode on the compound semiconductor layer; attaching a second lamination film on the back electrode; removing the first lamination film; removing the second protective layer; removing the first protective layer; and forming a front electrode on the compound semiconductor layer.

20 Claims, 6 Drawing Sheets

(a)

(b)

(c)

(d)

METHOD FOR MANUFACTURING A COMPOUND SEMICONDUCTOR SOLAR CELL

CROSS-REFERENCE TO RELATED APPLICATION

This application claims priority to and the benefit of Korean Patent Application No. 10-2017-0047311 filed in the Korean Intellectual Property Office on Apr. 12, 2017, the entire contents of which are incorporated herein by reference.

BACKGROUND OF THE INVENTION

Field of the Invention

Embodiments of the invention relate to a method for manufacturing a compound semiconductor solar cell, and more particularly, to a method for manufacturing a compound semiconductor solar cell capable of improving the yield by securing stability in an ELO (epitaxial lift off) process and a protective metal layer removing process.

Background of the Related Art

A compound semiconductor is not made of a single element such as silicon (Si) and germanium (Ge) and is formed by a combination of two or more kinds of elements to operate as a semiconductor. Various kinds of compound semiconductors have been currently developed and used in various fields. The compound semiconductors are typically used for a light emitting element, such as a light emitting diode and a laser diode, and a solar cell using a photoelectric conversion effect, a thermoelectric conversion element using a Peltier effect, and the like.

A compound semiconductor solar cell includes various compound semiconductor layers such as a light absorbing layer for absorbing solar light to generate an electron-hole pair, a contact layer for realizing ohmic contact with a metal electrode, a surface field layer for guiding the charge generated in the light absorbing layer to the metal electrode, and a window layer located on a front surface (for example, a light incident surface) of the solar cell. The various compound semiconductor layers are formed of a III-V compound semiconductor such as gallium arsenide (GaAs), indium phosphide (InP), gallium indium phosphide (GaInP), aluminum indium phosphide (AlInP), aluminum gallium indium phosphide (AlGaInP), gallium aluminum arsenide (GaAlAs) and gallium indium arsenide (GaInAs), a II-VI compound semiconductor such as cadmium sulfide (CdS), cadmium tellurium (CdTe) and zinc sulfide (ZnS), a I-III-VI compound semiconductor such as copper indium selenium ($CuInSe_2$).

Hereinafter, a conventional method of forming the various compound semiconductor layers will be described.

First, a sacrificial layer is formed on one side of a mother substrate that serves as a base for providing a suitable lattice structure in which a light absorbing layer (PV) is formed (S210), a compound semiconductor layer is formed on the sacrificial layer (S220), and a single-layered protective metal layer is deposited on a front contact layer of the compound semiconductor layer (S230).

Then, a first lamination film is attached on the protective metal layer (S240), and an ELO process using an acid etchant such as hydrofluoric acid (HF) is performed to remove the sacrifice layer, thereby the compound semiconductor layer, the protective metal layer and the lamination film are separated from the mother substrate (S250).

Next, a back electrode is formed on a back contact layer of the compound semiconductor layer (S260), and a second lamination film is attached on the back electrode (S270).

Thereafter, the first lamination film is removed (S280), the protective metal layer located on the front contact layer of the compound semiconductor layer is removed (S290), a front electrode is formed on the front contact layer (S300), and the front contact layer is patterned by performing an etching process using the front electrode as a mask (S310).

However, when the compound semiconductor solar cell is manufactured according to the above-described process, peeling occurs at an interface between the protective metal layer and the first lamination film. And during the etching process for removing the metal protective layer, peeling also occurs at an interface between the front contact layer and the protective metal layer.

As described above, according to the conventional manufacturing method, the compound semiconductor layer cannot be effectively supported by the lamination film during the manufacturing process of the compound semiconductor solar cell, so that breakage occurs, thereby reducing the effective area of the solar cell.

Further, when the protective metal layer is removed after the ELO process, a part of the front contact layer is etched, thereby the open circuit voltage (Voc) or the fill factor (FF) of the solar cell is decreases.

Therefore, there is a need for a method of manufacturing a compound semiconductor solar cell capable of improving the yield by securing stability in an ELO (epitaxial lift off) process and a protective metal layer removing process.

SUMMARY OF THE INVENTION

It is an object of the present invention to provide a method for manufacturing a compound semiconductor solar cell capable of improving the yield by securing stability in an ELO process and a protective metal layer removing process.

According to an aspect of the present invention, there is provided a method for manufacturing a compound semiconductor solar cell, comprising: forming a sacrificial layer on one surface of a mother substrate; forming a compound semiconductor layer on the sacrificial layer; forming a first protective layer formed of a compound semiconductor on the compound semiconductor layer; depositing a second passivation layer on the first passivation layer; attaching a first lamination film on the second protective layer; separating the compound semiconductor layer, the first and second protective layers, and the first lamination film from the mother substrate by performing an ELO process to remove the sacrificial layer; forming a back electrode on the compound semiconductor layer; attaching a second lamination film on the back electrode; removing the first lamination film; removing the second protective layer; removing the first protective layer; and forming a front electrode on the compound semiconductor layer.

A layer of the compound semiconductor layer that is in direct contact with the first passivation layer may be formed of GaAs, and the first passivation layer may be formed of a compound semiconductor other than the GaAs.

The compound semiconductor layer can be manufactured by sequentially epitaxially growing a back contact layer, a light absorbing layer, and a front contact layer on the sacrificial layer.

When the compound semiconductor layer has the stacked structure, the front contact layer is formed of GaAs, and the first passivation layer may be formed of any one compound semiconductor selected from GaInP, AlInP, and AlGaInP.

When the uppermost layer of the compound semiconductor layer in direct contact with the first passivation layer and the first passivation layer are formed of different compound semiconductors as described above, it is possible to effectively prevent the phenomenon that the compound semiconductor layer and the protective layer, particularly the compound semiconductor layer and the first protective layer, are peeled off, and effectively prevent a part of the compound semiconductor layer from being etched during the etching process for removing the protective layer.

Since the front contact layer formed of GaAs has corrosion resistance to hydrochloric acid (HCL), the first passivation layer can be removed with an etching solution containing hydrochloric acid.

The second passivation layer may be formed of a first metal layer and a second metal layer formed of a metal different from the first metal layer.

The first metal layer may be formed of copper, and the first metal layer can be removed with an etching solution containing ammonium hydroxide ($NH_4OH$) and hydrogen peroxide ($H_2O_2$). At this time, the second metal layer is excellent in corrosion resistance to the etching solution used for removing the first metal layer, so that the second metal layer is not removed during the removal of the first metal layer.

The second protective layer may be formed to a thickness of 1 to 10 μm, and a thickness of the first metal layer may be 80% or more of the thickness of the second protective layer.

The second metal layer may be formed of a material capable of preventing the surface of the first metal layer from being oxidized or a material having corrosion resistance to the etching solution used for removing the first metal layer. For example, the second metal layer may be formed of at least one selected from the group consisting of silver (Ag), gold (Au), platinum (Pt), palladium (Pd), nickel (Ni) and molybdenum (Mo).

As an example, the second metal layer may be removed with an etchant different from the etchant used to remove the first metal layer. For example, the second metal layer may be removed with an etching solution comprising at least one of potassium iodide (KI) and potassium cyanide ($H_2O_2$).

The second metal layer may be formed between the first protective layer and the first metal layer, and/or between the first metal layer and the first lamination film.

When the second metal layer is formed between the first protective layer and the first metal layer, the first protective layer can be protected during the etching process for removing the second metal layer and the ELO process. Therefore, the peeling phenomenon occurring between the first protective layer and the second protective layer, particularly, the first metal layer, can be prevented.

When the second metal layer is formed between the first metal layer and the first lamination film, the second metal layer can suppress formation of an oxide film on the surface of the first metal layer. Therefore, the peeling phenomenon occurring between the second protective layer and the first lamination film during the etching process, particularly the ELO process, can be prevented.

At least two first metal layers may be formed. In this case, the second metal layer may be further formed between the at least two first metal layers.

Hydrofluoric acid (HF) may be used as an etching solution in the ELO process.

The first lamination film and the second lamination film may be formed of a PET film serving as a supporting substrate and an EVA film positioned on one side of the PET film and acting as an adhesive, respectively.

At this time, when the thicknesses of the PET film and the EVA film are respectively formed to a thickness of 25 to 75 μm and the first lamination film and the second lamination film are respectively attached at a temperature of 70 to 150° C., the PET film is condensed and deformed while the temperature of the lamination film is lowered. Therefore, the time for performing the ELO process can be shortened, and the productivity of the large-area compound semiconductor solar cell can be improved.

Between the step of performing the ELO process and the step of forming the back electrode, a step of attaching the first carrier substrate on the first lamination film may be further included.

Between the step of attaching the second lamination film and the step of removing the first lamination film, the step of attaching the second carrier substrate on the second lamination film and the step of removing the first carrier substrate may be further included.

Then, after the step of forming the front electrode, the step of removing the second carrier substrate and the step of removing the second lamination film may be further included.

According to the method of manufacturing a compound semiconductor solar cell according to the present invention, stability in a plurality of etching processes (for example, the ELO process and a protective metal layer removal process) used during a process for manufacturing a compound semiconductor solar cell can be secured. Accordingly, the yield of the compound semiconductor solar cell can be improved.

Further, the time required for the ELO process can be shortened, and the productivity of a large-area compound semiconductor solar cell can be improved.

DETAILED DESCRIPTION OF THE EMBODIMENTS

Figure 1:
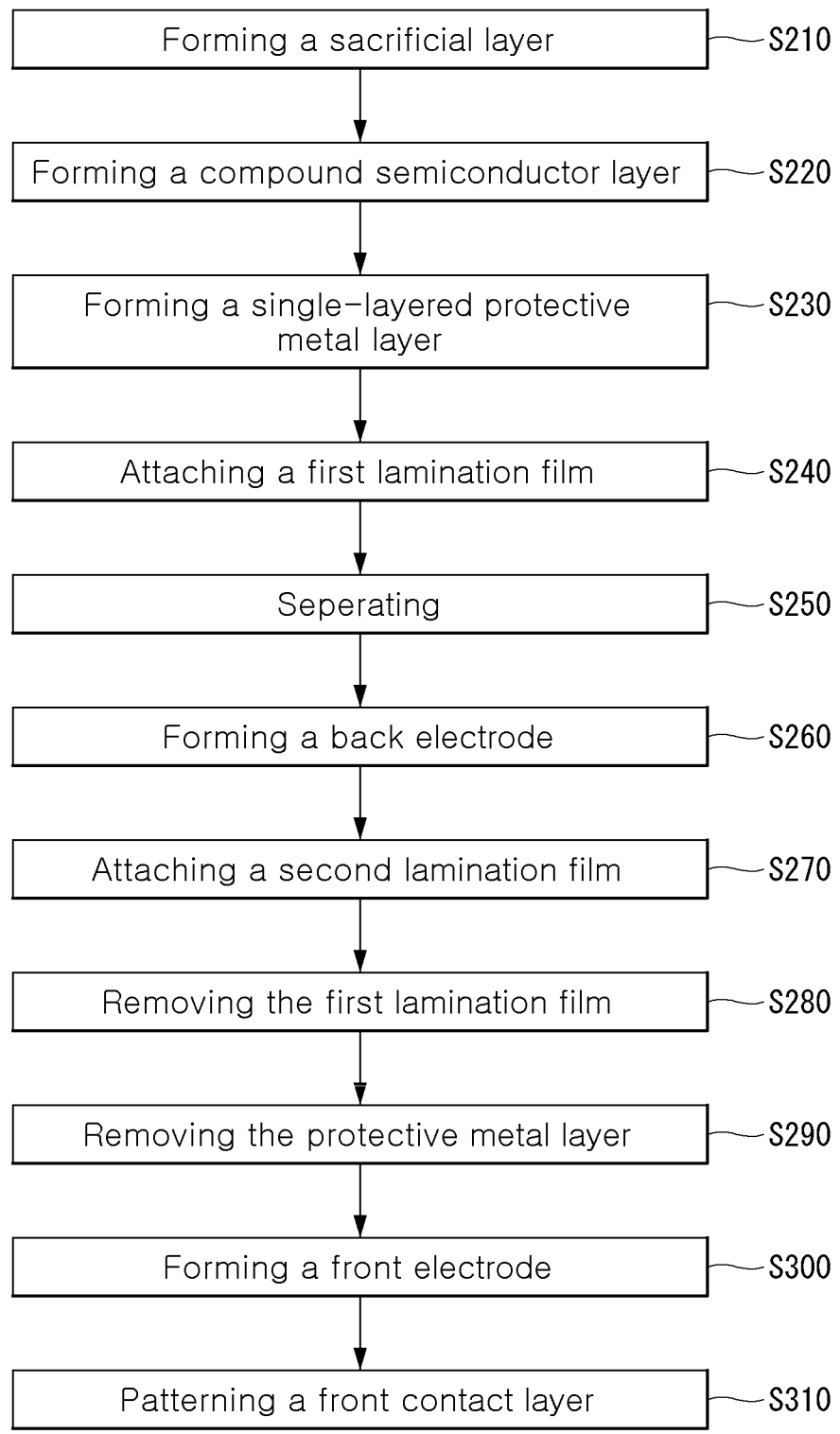
FIG. 1 is a block diagram showing a conventional method for manufacturing a compound semiconductor solar cell.
Figure 2:
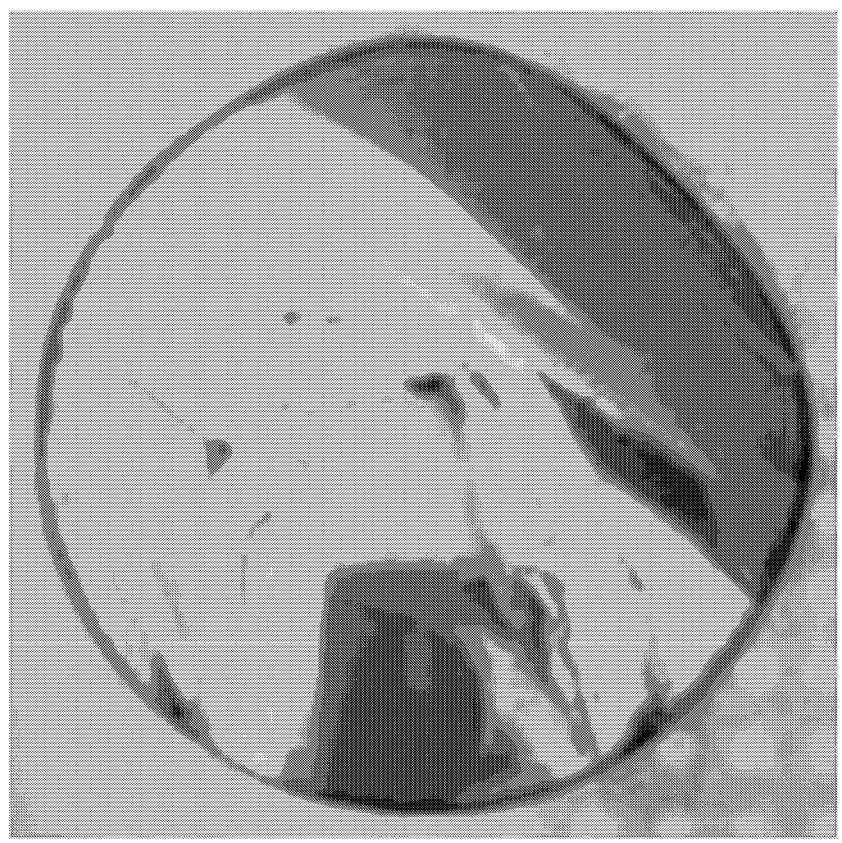
FIG. 2 is an image showing a state in which peeling occurs at an interface between a protective metal layer and a first lamination film after the ELO process is performed by the manufacturing method shown in FIG. 1.

Reference will now be made in detail to embodiments of the invention examples of which are illustrated in the accompanying drawings. Since the invention may be modified in various ways and may have various forms, specific embodiments are illustrated in the drawings and are described in detail in the specification. However, it should be understood that the invention are not limited to specific disclosed embodiments, but include all modifications, equivalents and substitutes included within the spirit and technical scope of the invention.

The terms 'first', 'second', etc., may be used to describe various components, but the components are not limited by such terms. The terms are used only for the purpose of distinguishing one component from other components.

For example, a first component may be designated as a second component without departing from the scope of the embodiments of the invention. In the same manner, the second component may be designated as the first component.

The term "and/or" encompasses both combinations of the plurality of related items disclosed and any item from among the plurality of related items disclosed.

When an arbitrary component is described as "being connected to" or "being linked to" another component, this should be understood to mean that still another component(s) may exist between them, although the arbitrary component may be directly connected to, or linked to, the second component.

On the other hand, when an arbitrary component is described as "being directly connected to" or "being directly linked to" another component, this should be understood to mean that no other component exists between them.

The terms used in this application are used to describe only specific embodiments or examples, and are not intended to limit the invention. A singular expression can include a plural expression as long as it does not have an apparently different meaning in context.

In this application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Unless otherwise specified, all of the terms which are used herein, including the technical or scientific terms, have the same meanings as those that are generally understood by a person having ordinary knowledge in the art to which the invention pertains.

The terms defined in a generally used dictionary must be understood to have meanings identical to those used in the context of a related art, and are not to be construed to have ideal or excessively formal meanings unless they are obviously specified in this application.

The following example embodiments of the invention are provided to those skilled in the art in order to describe the invention more completely. Accordingly, shapes and sizes of elements shown in the drawings may be exaggerated for clarity.

Hereinafter, a method for manufacturing a compound semiconductor solar cell according to the present invention will be described with reference to the accompanying drawings.

Figure 3:
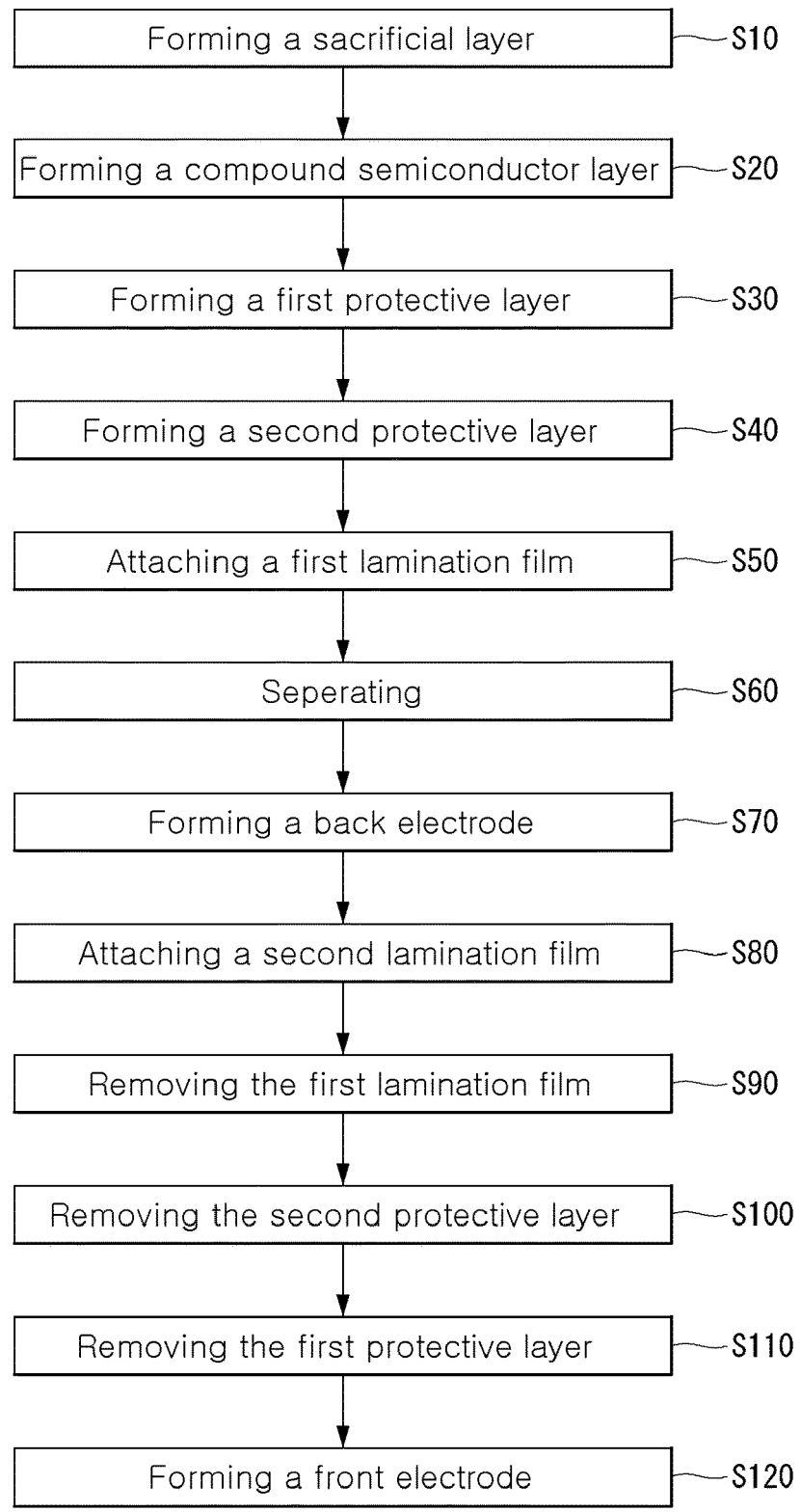
FIG. 3 is a block diagram showing a method of manufacturing a compound semiconductor solar cell according to the present invention.
Figure 4:
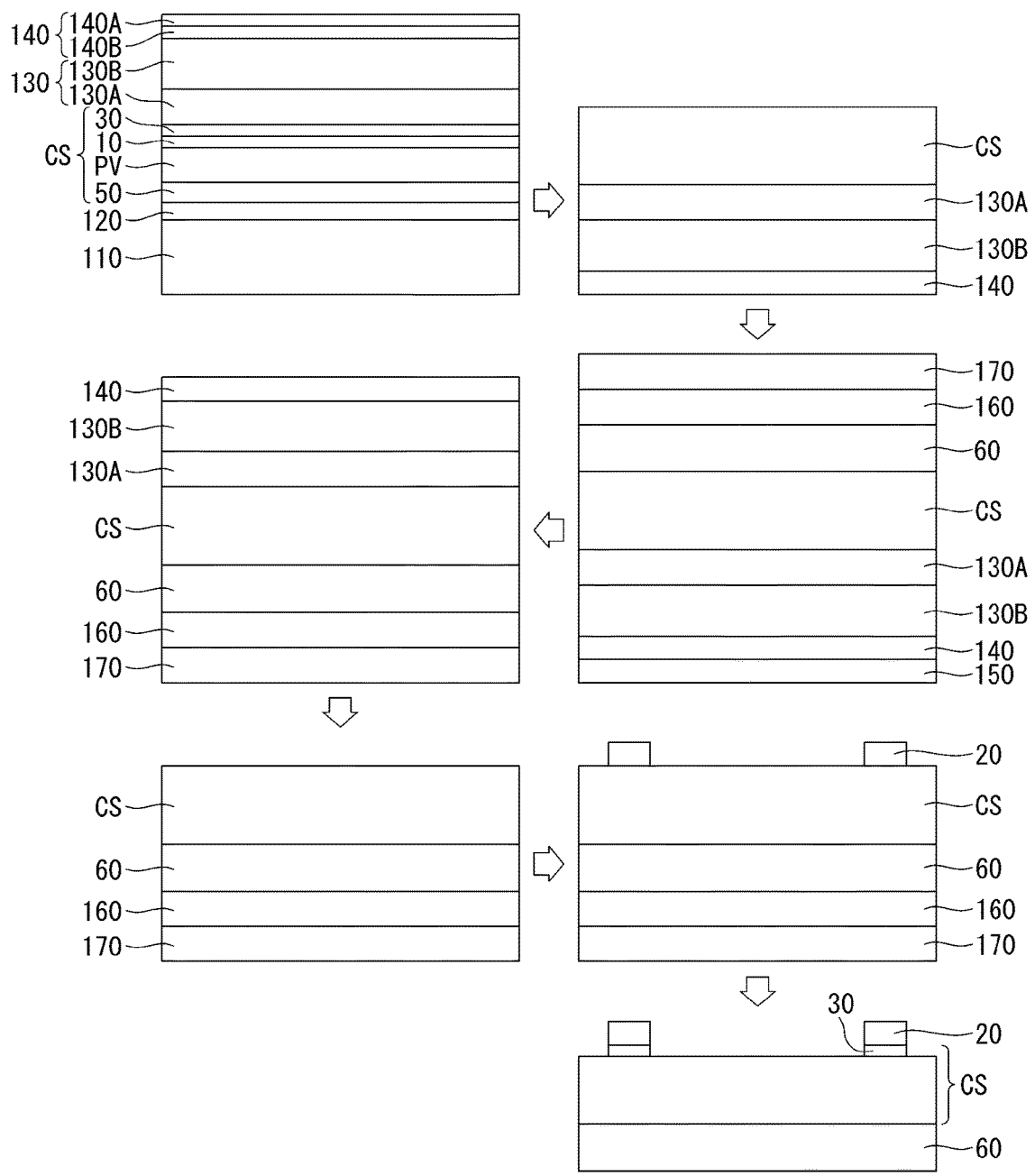
FIG. 4 is a process chart showing the manufacturing method of FIG. 3 in detail.

FIG. 3 is a block diagram showing a method of manufacturing a compound semiconductor solar cell according to the present invention, and FIG. 4 is a process chart showing the manufacturing method of FIG. 3 in detail.

Figure 5:
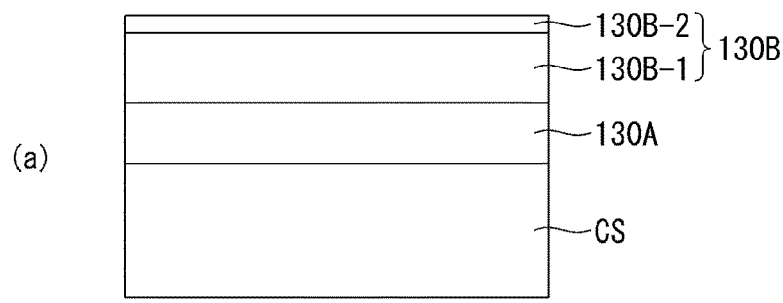
FIG. 5 is a cross-sectional view showing various embodiments of a first protective layer and a second protective layer shown in FIG. 4.
Figure 5:
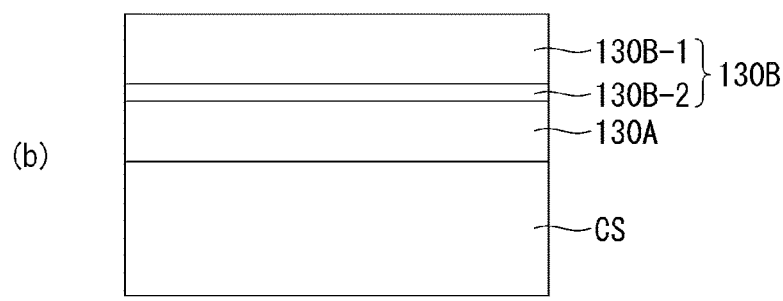
Figure 5:
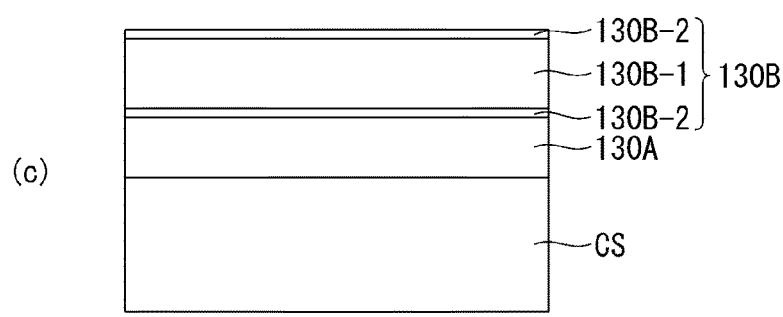
Figure 5:
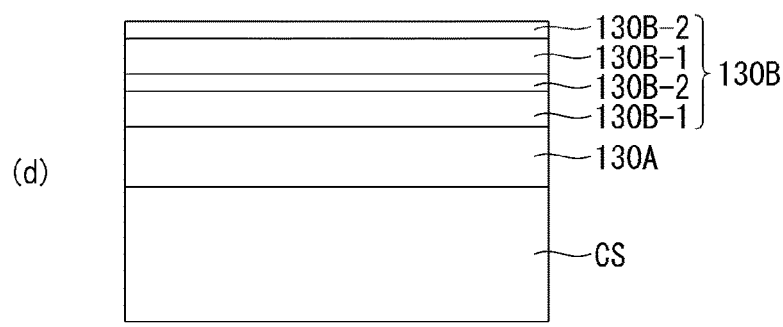
Figure 6:
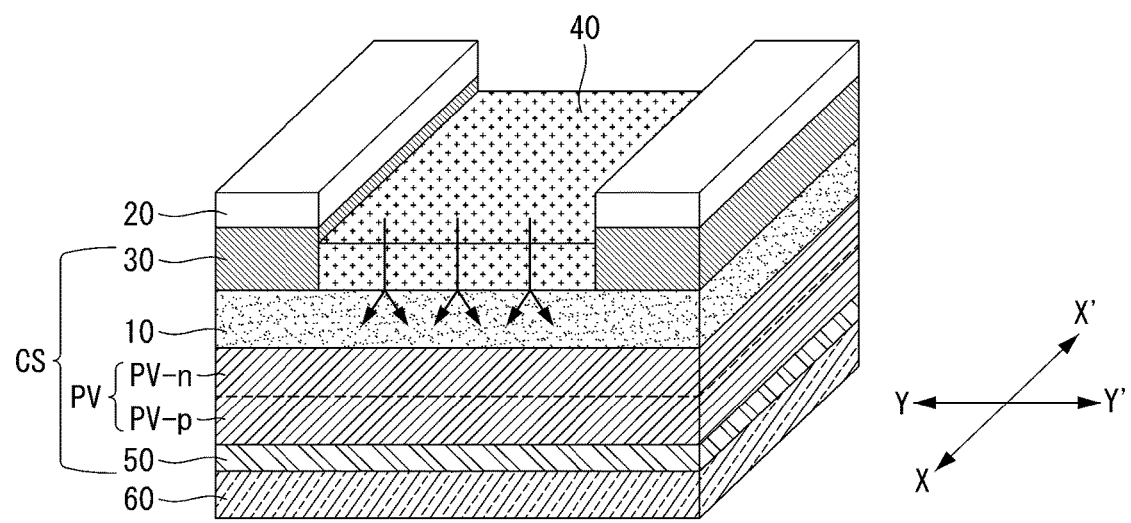
FIG. 6 is a perspective view of a compound semiconductor solar cell manufactured by the manufacturing method of FIG. 4.

FIG. 5 is a cross-sectional view showing various embodiments of a first protective layer and a second protective layer shown in FIG. 4, and FIG. 6 is a perspective view of a compound semiconductor solar cell manufactured by the manufacturing method of FIG. 4.

First, a compound semiconductor solar cell manufactured by the manufacturing method of the present invention will be described with reference to FIG. 6.

The compound semiconductor solar cell may include a light absorbing layer PV, a window layer 10 positioned on a front surface of the light absorbing layer PV, a front electrode 20 positioned on the window layer 10, a front contact layer 30 positioned between the window layer 10 and the front electrode 20, an antireflection layerer 40 positioned on the window layer 10, a back contact layer 50 positioned on a back surface of the light absorbing layer PV, and a back electrode 60 positioned on a back surface of the back contact layer 50.

At least one of the antireflection layer 40, the window layer 10, the front contact layer 30 and the back contact layer 50 may be omitted. However, as shown in FIG. 6, the case where both are provided will be described as an example.

The light absorbing layer PV may be formed to include a III-VI group semiconductor compound. For example, GaInP compound containing gallium (Ga), indium (In) and phosphide (P), or GaAs compound containing gallium (Ga) and arsenic (As).

Hereinafter, the light absorbing layer PV includes a GaAs compound as an example.

The light absorbing layer PV may include a p-type semiconductor layer PV-p doped with an impurity of a first conductive type and an n-type semiconductor layer PV-n doped with an impurity of a second conductive type opposite the first conductive type.

The light absorbing layer PV may further include a back surface field layer on a back surface of the p-type semiconductor layer.

The p-type semiconductor layer PV-p may be formed by doping a p-type impurity into the above-described compound, and the n-type semiconductor layer PV-n may be formed by doping an n-type impurity into the above-described compound.

Herein, the p-type impurity may be selected from carbon, magnesium, zinc or a combination thereof, and the n-type impurity may be selected from silicon, selenium, tellurium or a combination thereof.

The n-type semiconductor layer PV-n may be positioned in a region adjacent to the front electrode 120. The p-type semiconductor layer PV-p may be positioned in a region directly under the n-type semiconductor layer PV-n and may be positioned in a region adjacent to the back electrode 60.

That is, the interval between the n-type semiconductor layer PV-n and the front electrode 20 is smaller than the interval between the p-type semiconductor layer PV-p and the front electrode 20, and the interval between the n-type semiconductor layer PV-n and the back electrode 60 is larger than the interval between the p-type semiconductor layer PV-p and the back electrode 60.

As a result, a p-n junction in which the p-type semiconductor layer PV-p and the n-type semiconductor layer PV-n are joined is formed in the light absorbing layer PV. The electron-hole pairs generated by the light are separated into electrons and holes by the internal potential difference formed by the p-n junction of the light absorbing layer PV so that electrons move toward the n-type semiconductor layer PV-n and holes move toward the p-type semiconductor layer PV-p.

Therefore, the holes generated in the light absorbing layer PV move to the back electrode 60 through the back contact layer 50 and the electrons generated in the light absorbing layer PV moves to the front electrode 20 through the window layer 10 and the front contact layer 30.

Alternatively, the p-type semiconductor layer PV-p may be positioned in a region adjacent to the front electrode 20 and the n-type semiconductor layer PV-n may be positioned in a region directly under the p-type semiconductor layer PV-p and may be positioned in a region adjacent to the back electrode 60. In this instance, the holes generated in the light absorbing layer PV move to the front electrode 20 through the front contact layer 30 and the electrons generated in the light absorbing layer PV move to the back electrode 60 through the back contact layer 50.

In the case where the light absorbing layer PV further includes the back surface field layer, the back surface field layer may have the same conductivity as the upper layer, that is, the n-type semiconductor layer PV-n or the p-type semiconductor layer PV-p and may be formed of the same material as the window layer 10.

In order to effectively block the movement of the charge (holes or electrons) to be moved toward the front electrode toward the back electrode, the back surface field layer is formed entirely on a back surface of the upper layer (for example, the n-type semiconductor layer PV-n or the p-type semiconductor layer PV-p) directly contacting with the back surface field layer.

That is, in the solar cell shown in FIG. 6, in the case where the back surface field layer is formed on the back surface of the p-type semiconductor layer PV-p, the back surface field layer functions to block the movement of electrons toward the back electrode 60. In order to effectively block the movement of electrons toward the back electrode 60, the back surface field layer is positioned on the entire back surface of the p-type semiconductor layer PV-p.

The light absorbing layer PV having such a structure may be formed on a mother substrate by a metal organic chemical vapor deposition (MOCVD) method, a molecular beam epitaxy (MBE) method, or any other suitable method for forming an epitaxial layer.

In the case of homogeneous junction, the p-type semiconductor layer PV-p and the n-type semiconductor layer PV1-n may be made of the same material having the same band gap. Alternatively, in the case of heterojunction, the p-type semiconductor layer PV1-p and the n-type semiconductor layer PV1-n may be made of different materials having different band gaps.

The window layer 10 may be formed between the light absorbing layer PV and the front electrode 20 and may be formed by doping an impurity of the second conductivity type into a III-VI group semiconductor compound.

However, when the p-type semiconductor layer PV-p is positioned on the n-type semiconductor layer PV-n and the window layer 10 is positioned on the p-type semiconductor layer PV-p, the window layer 10 may include the first conductivity type (i.e., the p-type) impurity.

However, the window layer 10 may not contain n-type or p-type impurities.

The window layer 10 serves to passivate the front surface of the light absorbing layer PV. Therefore, when the carrier (electrons or holes) moves to the surface of the light absorbing layer PV, the window layer 10 can prevent the carriers from recombining on the surface of the light absorbing layer PV.

Since the window layer 10 is disposed on the front surface (i.e., light incident surface) of the light absorbing layer PV, in order to prevent light incident on the light absorbing layer PV from being absorbed, the window layer 10 may have an energy band gap higher than the energy band gap of the light absorbing layer PV.

In order to form the energy band gap of the window layer 10 higher than the energy band gap of the light absorption layer, the window layer 10 may further contain aluminum (Al).

The antireflection layer 40 may be located on the front surface of the window layer 110 except the region where the front electrode 20 and/or the front contact layer 30 are located.

Alternatively, the antireflection layer 40 may be disposed on the front contact layer 30 and the front electrode 20 as well as the exposed window layer 10.

In this instance, the compound semiconductor solar cell may further include at least one bus bar electrodes physically connecting the plurality of front electrodes 20, and the bus bar electrode may not be covered by the antireflection layer 40 and can be exposed to the outside.

The antireflection layer 40 having such a structure may include magnesium fluoride, zinc sulfide, titanium oxide, silicon oxide, derivatives thereof, or a combination thereof.

The front electrode 20 may be formed to extend in the first direction X-X', and a plurality of the front electrodes 20 may be spaced apart from each other along a second direction Y-Y' orthogonal to the first direction.

The front electrode 20 may be formed to include an electrically conductive material. For example, the front electrode 20 may include at least one of gold (Au), germanium (Ge), and nickel (Ni).

The front contact layer 30 positioned between the window layer 10 and the front electrode 20 is formed by doping the second impurity with a dopant concentration higher than the impurity doping concentration of the window layer 10 into the III-V compound semiconductor.

The front contact layer 30 forms an ohmic contact between the window layer 10 and the front electrode 20. That is, when the front electrode 20 directly contacts the window layer 10, the ohmic contact between the front electrode 20 and the light absorbing layer PV is not well formed because the impurity doping concentration of the window layer 10 is low. Therefore, the carrier moved to the window layer 10 cannot move to the front electrode 20 and can be destroyed.

However, when the front contact layer 30 is formed between the front electrode 20 and the window layer 10, since the front contact layer 30 forms an ohmic contact with the front electrode 20, the carrier is smoothly moved and the short circuit current density Jsc of the compound semiconductor solar cell increases. Thus, the efficiency of the solar cell can be further improved.

In order to form an ohmic contact with the front electrode 20, the doping concentration of the second dopant doped in the front contact layer 30 may be greater than the doping concentration of the second dopant doped in the window layer 10.

The front contact layer 30 is formed in the same shape as the front electrode 20.

A back contact layer 50 disposed on the back surface of the p-type semiconductor layer PV-p of the light absorbing layer PV (or the back surface of the back surface field layer when the light absorbing layer PV includes the back surface field layer) is entirely positioned on the back surface of the light absorbing layer PV. The back contact layer 50 may be formed by doping the first conductive type impurity into the III-VI group semiconductor compound at a doping concentration higher than that of the p-type semiconductor layer PV-p.

The back contact layer 50 forms an ohmic contact with the back electrode 60, so that the short circuit current density Jsc of the compound semiconductor solar cell can be further improved. Thus, the efficiency of the solar cell can be further improved.

A thickness of the front contact layer 30 and a thickness of the back contact layer 50 may each be 100 nm to 300 nm. For example, the front contact layer 30 may be formed with a thickness of 100 nm and the back contact layer 50 may be formed with a thickness of 300 nm.

The back electrode 60 positioned on the back surface of the back contact layer 50 may be a sheet-like conductive layer positioned entirely on the back surface of the light absorbing layer PV, different from the front electrode 20. That is, the back electrode 60 may be referred to as a sheet electrode located on the entire rear surface of the light absorbing layer PV.

At this time, the back electrode 60 may be formed in the same planar area as the light absorbing layer PV and may be formed of at least one material selected from the group consisting of gold (Au), platinum (Pt), titanium (Ti), tungsten (W), silicon (Si), nickel (Ni), magnesium (Mg), palladium (Pd), copper (Cu), and germanium (Ge). The material forming the back electrode 60 may be suitably selected according to the conductivity type of the back contact layer BC.

For example, when the back contact layer 50 contains a p-type impurity, the back electrode 60 may be formed any one of gold (Au), platinum (Pt)/titanium (Ti), tungsten-silicon alloy (WSi), and silicon (Si)/nickel (Ni)/magnesium (Mg)/nickel (Ni). Preferably, the back electrode 60 may be formed of gold (Au) having a low contact resistance with the p-type back contact layer 50.

If the back contact layer 50 contains n-type impurities, the back electrode 60 may be formed any one of palladium (Pd)/gold (Au), copper (Cu)/germanium (Ge), nickel (Ni)/germanium (Ge)-gold (Au) alloy (GeAu)/nickel (Ni), gold (Au)/titanium (Ti). Preferably, the back electrode 60 may be formed of palladium (PD)/gold (Au) having a low contact resistance with the p-type back contact layer 50.

However, the material forming the back electrode 60 can be appropriately selected among the materials, and in particular, can be appropriately selected from materials having low contact resistance with the back contact layer 50.

Hereinafter, a method for manufacturing the above-described compound semiconductor solar cell will be described.

The manufacturing method of the present invention comprises forming a sacrificial layer on one side of a mother substrate (S10), forming the compound semiconductor layer on the sacrificial layer (S20), forming a first protective layer formed of a compound semiconductor on the compound semiconductor layer (S30), depositing a second protective layer formed of a metal on the first protective layer (S40), attaching a first lamination film on the second protective layer (S50), separating the compound semiconductor layer, the first and second protective layers, and the first lamination film from the mother substrate by performing an ELO process to remove the sacrificial layer (S60), forming a back electrode on the compound semiconductor layer (S70), attaching a second lamination film on the back electrode (S80), removing the first lamination film (S90), removing the second protective layer (S100), removing the first protective layer (S110), and forming a front electrode on the compound semiconductor layer (S120). At this time, a layer of the compound semiconductor layer that is in direct contact with the first passivation layer is formed of GaAs, and the first passivation layer is formed of a compound semiconductor other than the GaAs.

More specifically, a sacrificial layer 120 is formed on one side of a mother substrate 110 serving as a base for providing a suitable lattice structure in which a light absorbing layer (PV) is formed (S10), and a compound semiconductor layer CS is formed on the sacrifice layer 120 (S20).

Here, the compound semiconductor layer CS may include the back contact layer 50, the light absorbing layer PV, the window layer 10, and the front contact layer 30.

In the case where the compound semiconductor layer CS includes the front contact layer 30, the front contact layer 30 may be formed entirely on the window layer 10 and may be formed of GaAs having good electrical conductivity for ohmic contact.

Then, a first passivation layer 130A formed of a compound semiconductor is formed on the compound semiconductor layer CS (S30), and a second passivation layer 130B formed of a metal is formed on the first passivation layer 130A (S40).

The first passivation layer 130A is formed of a compound semiconductor other than GaAs, preferably any one compound semiconductor selected from GaInP, AlInP, and AlGaInP.

When the first passivation layer 130A and the front contact layer 30 are formed of different compound semiconductors, it is possible to effectively prevent the phenomenon that the compound semiconductor layer CS and the first and second protective layers 130A and 130B, particularly the compound semiconductor layer CS and the second protective layer 130B, are peeled off, and effectively prevent a part of the compound semiconductor layer CS from being etched during the etching process for removing the second protective layer 130B.

The sacrificial layer 120, the compound semiconductor layer CS and the first passivation layer 130A may be formed by any one of MOCVD (Metal Organic Chemical Vapor Deposition), MBE (Molecular Beam Epitaxy), or an arbitrary method for forming an epitaxial layer, and can be formed by a regular growth method.

The second protective layer 130B includes a first metal layer 130B-1 formed of copper having excellent corrosion resistance and a second metal layer 130B-2 formed of a different metal from the first metal layer 130B-1.

The second metal layer 130B-2 may be formed of a metal capable of preventing a surface of the first metal layer 130B-1 from being oxidized or a material having corrosion resistance to the etching solution used for removing the first metal layer 130B-1. For example, the second metal layer 130B-2 may be formed of at least one selected from silver (Ag), gold (Au), platinum (Pt), palladium (Pd), nickel (Ni) and molybdenum (Mo).

FIG. 5 is a sectional view showing various embodiments of the first protective layer 130A and the second protective layer 130B. As shown in the FIG. 5, the second metal layer 130B-2 may be formed between the first protective layer 130A and the first metal layer 130B-1, and/or between the first metal layer 130B-1 and the first lamination film 140. When the first metal layer 130B-1 is at least two, the second metal layer 130B-2 may be further formed between the at least two first metal layers 130B-1.

When the second metal layer 130B-2 is formed between the first protective layer 130A and the first metal layer 130B-1, the first protective layer 130A can be protected during the etching process for removing the second metal layer 130B-2 and the ELO process. Therefore, the peeling phenomenon occurring between the first protective layer 130A and the second protective layer 130B, particularly, the first protective layer 130A and the first metal layer 130B-1, can be prevented.

When the second metal layer 130B-2 is formed between the first metal layer 130B-1 and the first lamination film 140, the second metal layer 130B-2 can suppress formation of an oxide film on the surface of the first metal layer 130B-1. Therefore, the peeling phenomenon occurring between the second protective layer 130B and the first lamination film 140 during the etching process, particularly the ELO process, can be prevented.

The second protective layer 130B may be formed to a thickness of 1 to 10 μm, and a thickness of the first metal layer 130B-1 may be 80% or more of the thickness of the second protective layer 130B to support the compound semiconductor layer CS during the manufacturing process of the compound semiconductor solar cell.

Next, the first lamination film 140 is attached on the second protective layer 130B (S50).

The first lamination film 140 may be formed of a PET film 140A serving as a support substrate and an EVA film 140B positioned on one side of the PET film 140A and acting as an adhesive.

At this time, when the thicknesses of the PET film 140A and the EVA film 140B are respectively formed to a thickness of 25 to 75 μm and the first lamination film 140 is attached at a temperature of 70 to 150° C., the PET film 140A is condensed and deformed while the temperature of the first lamination film is lowered. Therefore, the time for performing the ELO process can be shortened, and the productivity of the large-area compound semiconductor solar cell can be improved.

As an example, the thicknesses of the PET film 140A and the EVA film 140B may be 50 μm, respectively, and the first lamination film 140 may be attached at a temperature of 100° C.

Next, the ELO process is performed to remove the sacrificial layer 120 (S60).

In the ELO process, hydrofluoric acid (HF) can be used as an etching solution. When the ELO process is performed, the sacrifice layer 120 is removed by the hydrofluoric acid (HF), so that the compound semiconductor layer CS, the first and second protective layers 130A and 130B and the first lamination film 140 can be separated from the mother substrate 110. And Due to the deformation of the first lamination film 140, the separation process can be completed in a short time.

When the ELO process is performed, the adhesive force between the first lamination film 140 and the second protective layer 130B is maintained by the second metal layer 130B-2. Accordingly, the first lamination film 140 is not peeled off from the second protective layer 130, and the first lamination film 140 can support the compound semiconductor layer CS.

Figure 7:
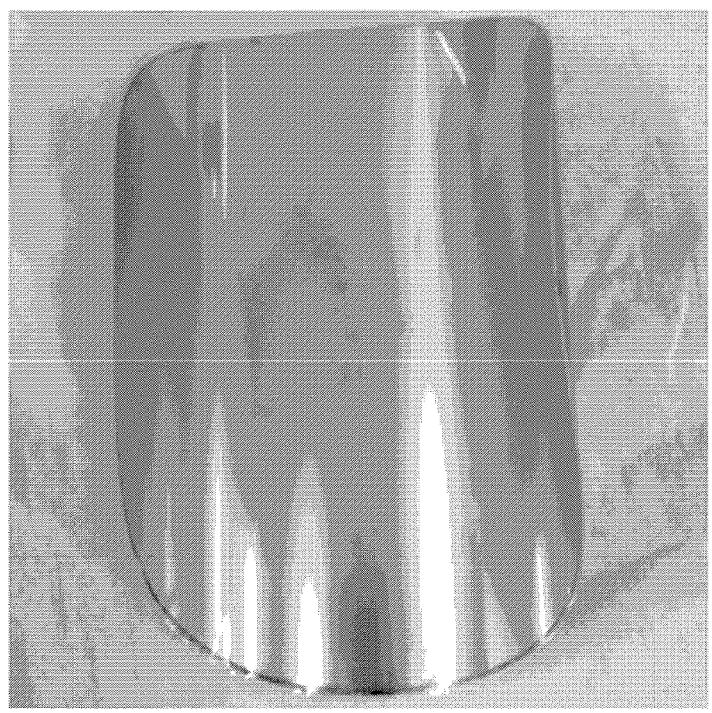
FIG. 7 is an image showing a state in which peeling is suppressed at an interface between the protective metal layer and the first lamination film after the ELO process is performed by the manufacturing method shown in FIG. 4.

Referring to the image of FIG. 7, it can be seen that the peeling between the first lamination film 140 and the second protective layer 130B after the ELO process is suppressed.

Next, the first carrier substrate 150 is attached on the back surface of the first lamination film 140 in a state where the first lamination film 140 is positioned below the second protection layer 130B, and a back electrode 60 is formed on the compound semiconductor layer CS (S70).

The back electrode 60 may be formed of at least one metal selected from Au, Pt, Ti, W, Si, Ni, Mg, Pd, Cu, and Ge, and can be formed as a single layer or a multi layer.

Next, the second lamination film 160 is attached on the back electrode 60 (S80).

The second lamination film 160 may have the same structure as the first lamination film 160 and may be attached in the same manner as the first lamination film 140.

Next, the second carrier substrate 170 is attached on the second lamination film 160 and the first carrier substrate 150 is disposed facing upward. Then, the first carrier substrate 150 and the first lamination film 140 are removed (S90).

Then, the second protective layer 130B is removed (S100).

The first metal layer 130B-1 is removed using an etching solution containing ammonium hydroxide ($NH_4OH$) and hydrogen peroxide ($H_2O_2$), and the second metal layer 130B-2 is removed with an etching solution different from the etching solution used for removing the first metal layer 130B-1. For example, the second metal layer 130b-2 may be removed with an etching solution comprising at least one of potassium iodide (KI) and potassium cyanide ($H_2O_2$).

According to this process, since the second metal layer 130B-2 is excellent in corrosion resistance against the etching solution used for removing the first metal layer 130B-1, the second metal layer 130B-2 is not removed during the removal of the first metal layer 130B-1.

When the second metal layer 130B-2 is formed between the first protective layer 130A and the first metal layer 130B-1, the first protective layer 130A can be protected during the etching process for removing the second metal layer 130B-2 and the ELO process. Therefore, the peeling phenomenon occurring between the first protective layer 130A and the second protective layer 130B can be prevented.

When the second metal layer 130B-2 is formed between the first metal layer 130B-1 and the first lamination film 140, the second metal layer 130B-2 can suppress formation of an oxide film on the surface of the first metal layer 130B-1. Therefore, the peeling phenomenon occurring between the second protective layer 130B and the first lamination film 140 during the etching process, particularly the ELO process, can be prevented Subsequently, the first protective layer 130A is removed (S110).

Since the front contact layer 30 formed of GaAs has corrosion resistance to hydrochloric acid (HCL), the first passivation layer 130A can be removed with an etching solution containing hydrochloric acid Next, a front electrode 20 is formed on the compound semiconductor layer CS (S120).

The front electrode 20 may be formed by depositing a metal only on a region where the front electrode is to be formed or by depositing a front electrode material on the front contact layer 30 and patterning the front electrode material.

Subsequently, the front contact layer 30 in an area not covered by the front electrode 20 is patterned using the front electrode 20 as a mask, and then the second carrier substrate 170 and the second lamination film 160 are removed to produce the compound semiconductor solar cell shown in FIG. 6 (S130).

In the above description, the compound semiconductor solar cell includes one light absorbing layer as an example, but a plurality of light absorbing layers may also be formed.

In this case, the lower light absorbing layer may include a GaAs compound that absorbs light in a long wavelength band and performs photoelectric conversion, and the upper light absorbing layer may include a GaInP compound that absorbs light in a short wavelength band and performs photoelectric conversion. A tunnel junction layer may be positioned between the upper light absorbing layer and the lower light absorbing layer.

Further, an intrinsic semiconductor layer may be further formed between the p-type semiconductor layer and the n-type semiconductor layer of the light absorption layer.

What is claimed is:

1. A method for manufacturing a compound semiconductor solar cell, comprising:
    forming a sacrificial layer on one surface of a mother substrate;
    forming a compound semiconductor layer on the sacrificial layer;
    forming a first protective layer formed of a compound semiconductor on the compound semiconductor layer;
    depositing a second passivation layer on the first passivation layer;
    attaching a first lamination film on the second protective layer;
    separating the compound semiconductor layer, the first and second protective layers, and the first lamination film from the mother substrate by performing an epitaxial lift off (ELO) process to remove the sacrificial layer;
    forming a back electrode on the compound semiconductor layer;
    attaching a second lamination film on the back electrode;
    removing the first lamination film;
    removing the second protective layer;
    removing the first protective layer; and
    forming a front electrode on the compound semiconductor layer.

2. The method for manufacturing a compound semiconductor solar cell of claim 1, wherein a layer of the compound semiconductor layer that is in direct contact with the first passivation layer is formed of gallium arsenide (GaAs), and the first passivation layer is formed of a compound semiconductor other than the GaAs.

3. The method for manufacturing a compound semiconductor solar cell of claim 2, wherein the first passivation layer is formed of any one compound semiconductor selected from gallium indium phosphide (GaInP), aluminum indium phosphide (AlInP), and aluminum gallium indium phosphide (AlGaInP).

4. The method for manufacturing a compound semiconductor solar cell of claim 3, wherein the first passivation layer is removed with an etching solution containing hydrochloric acid (HCL).

5. The method for manufacturing a compound semiconductor solar cell of claim 1, wherein the second passivation layer is formed of a first metal layer and a second metal layer formed of a metal different from the first metal layer.

6. The method for manufacturing a compound semiconductor solar cell of claim 5, wherein the first metal layer is formed of copper (Cu), and the first metal layer is removed with an etching solution containing ammonium hydroxide ($NH_4OH$) and hydrogen peroxide ($H_2O_2$).

7. The method for manufacturing a compound semiconductor solar cell of claim 6, wherein the second protective layer is formed to a thickness of 1 to 10 μm.

8. The method for manufacturing a compound semiconductor solar cell of claim 7, wherein a thickness of the first metal layer is 80% or more of the thickness of the second protective layer.

9. The method for manufacturing a compound semiconductor solar cell of claim 7, wherein the second metal layer is formed of at least one selected from silver (Ag), gold (Au), platinum (Pt), palladium (Pd), nickel (Ni), and molybdenum (Mo).

10. The method for manufacturing a compound semiconductor solar cell of claim 9, wherein the second metal layer is removed with an etching solution comprising at least one of potassium iodide (KI) and potassium cyanide ($H_2O_2$).

11. The method for manufacturing a compound semiconductor solar cell of claim 9, wherein the second metal layer is formed between the first protective layer and the first metal layer, and/or between the first metal layer and the first lamination film.

12. The method for manufacturing a compound semiconductor solar cell of claim 11, wherein at least two first metal layers are formed.

13. The method for manufacturing a compound semiconductor solar cell of claim 12, wherein the second metal layer is further formed between the at least two first metal layers.

14. The method for manufacturing a compound semiconductor solar cell of claim 6, wherein hydrofluoric acid (HF) is used as an etching solution in the ELO process.

15. The method for manufacturing a compound semiconductor solar cell of claim 6, wherein the first lamination film and the second lamination film are respectively formed of a PET film serving as a supporting substrate and an EVA film positioned on one side of the PET film and acting as an adhesive.

16. The method for manufacturing a compound semiconductor solar cell of claim 15, wherein the PET film and the EVA film are formed to a thickness of 25 to 75 μm, respectively.

17. The method for manufacturing a compound semiconductor solar cell of claim 16, wherein the first lamination film and the second lamination film are attached at a temperature of 70 to 150° C., respectively.

18. The method for manufacturing a compound semiconductor solar cell of claim 16, further comprising attaching a first carrier substrate on the first lamination film between the step of performing the ELO process and the step of forming the back electrode.

19. The method for manufacturing a compound semiconductor solar cell of claim 18, further comprising attaching a second carrier substrate on the second lamination film and removing the first carrier substrate between the step of attaching the second lamination film and the step of removing the first lamination film.

20. The method for manufacturing a compound semiconductor solar cell of claim 19, further comprising removing the second carrier substrate and removing the second lamination film after the step of forming the front electrode.

* * * * *